(12) United States Patent
Reis et al.

(10) Patent No.: US 12,484,197 B2
(45) Date of Patent: Nov. 25, 2025

(54) SYSTEMS AND METHODS FOR A TOP SIDE COOLED POWER SEMICONDUCTOR THERMAL INTERFACE SPACER

(71) Applicant: BorgWarner US Technologies LLC, Wilmington, DE (US)

(72) Inventors: Alexandre M. S. Reis, Westfield, IN (US); Bryan Alan Rohl, Westfield, IN (US); Thomas Alan Degenkolb, Noblesville, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 456 days.

(21) Appl. No.: 18/182,482

(22) Filed: Mar. 13, 2023

(65) Prior Publication Data

US 2024/0314979 A1    Sep. 19, 2024

(51) Int. Cl.
  *H05K 7/20* (2006.01)
  *H01L 23/367* (2006.01)
  *H01L 23/40* (2006.01)
  *H01L 25/11* (2006.01)

(52) U.S. Cl.
  CPC ..... *H05K 7/20445* (2013.01); *H01L 23/3675* (2013.01); *H05K 7/209* (2013.01); *H01L 23/40* (2013.01); *H01L 25/115* (2013.01); *H01L 2225/06589* (2013.01); *H01L 2225/1094* (2013.01); *H05K 7/20436* (2013.01)

(58) Field of Classification Search
  CPC ................ H01L 23/3675; H01L 23/40; H01L 2225/1094; H01L 2225/06589; H05K 7/20436; H05K 7/20445; H05K 7/20454
  See application file for complete search history.

(56) References Cited

U.S. PATENT DOCUMENTS

| | | | |
|---|---|---|---|
| 6,936,919 B2 | 8/2005 | Chuang | |
| 9,818,625 B2 | 11/2017 | Li | |
| 11,031,314 B2 | 6/2021 | Park | |
| 11,659,689 B2* | 5/2023 | Ritter | ................... H05K 9/0032 |
| | | | 174/252 |
| 2014/0091512 A1 | 4/2014 | Lin | |
| 2017/0181266 A1* | 6/2017 | Hunt | ................... H05K 7/20445 |
| 2020/0045850 A1 | 2/2020 | Bala et al. | |

(Continued)

FOREIGN PATENT DOCUMENTS

| | | | | | |
|---|---|---|---|---|---|
| CN | 119340285 A | * | 1/2025 | ............... | H02K 9/00 |
| CN | 120221518 A | * | 6/2025 | ......... | H01L 21/4882 |

(Continued)

*Primary Examiner* — David A Zarneke
(74) *Attorney, Agent, or Firm* — Joshua M. Haines; Bookoff McAndrews, PLLC

(57) ABSTRACT

A power semiconductor package includes: a first power semiconductor; a cold plate including a floor and a first pedestal extending from the floor, wherein the first pedestal is configured to support the first power semiconductor; a thermal interface material configured to transfer heat from the first power semiconductor to the first pedestal of the cold plate; and a spacer including: a first frame configured to receive at least a portion of the first pedestal, and a second frame configured to receive the thermal interface material; wherein the spacer is configured to provide a uniform thickness of the thermal interface material between the first pedestal of the cold plate and the first power semiconductor.

20 Claims, 7 Drawing Sheets

(56) References Cited

U.S. PATENT DOCUMENTS

| | | |
|---|---|---|
| 2020/0066508 A1 | 2/2020 | Doris |
| 2021/0305227 A1* | 9/2021 | Chen ........................ H01L 25/18 |
| 2022/0130734 A1* | 4/2022 | Chiu ........................ H01L 23/31 |
| 2025/0285934 A1* | 9/2025 | Ramdas ................... H01L 24/32 |

FOREIGN PATENT DOCUMENTS

| | | | |
|---|---|---|---|
| JP | 2013123011 A | * | 6/2013 |
| WO | 2022192031 A1 | | 9/2022 |

\* cited by examiner

SYSTEMS AND METHODS FOR A TOP SIDE COOLED POWER SEMICONDUCTOR THERMAL INTERFACE SPACER

TECHNICAL FIELD

Various embodiments of the present disclosure relate generally to a thermal interface spacer, and, more particularly, to systems and methods for a top side cooled power semiconductor thermal interface spacer.

INTRODUCTION

A power electronics package may use power semiconductor switches. The power semiconductor switches are cooled during operation of the power electronics package. A cold plate (e.g., a heat sink) may be used to transfer heat from the power semiconductor switches, and thus cool the power semiconductor switches. A cold plate that does not efficiently remove heat from the power semiconductor switches may lead to improper operation of the power semiconductor switches and the power electronics package.

The present disclosure is directed to overcoming one or more of these above-referenced challenges.

SUMMARY OF THE DISCLOSURE

In some aspects, the techniques described herein related to a power semiconductor package including: a first power semiconductor; a cold plate including a floor and a first pedestal extending from the floor, wherein the first pedestal is configured to support the first power semiconductor; a thermal interface material configured to transfer heat from the first power semiconductor to the first pedestal of the cold plate; and a spacer including: a first frame configured to receive at least a portion of the first pedestal, and a second frame configured to receive the thermal interface material; wherein the spacer is configured to provide a uniform thickness of the thermal interface material between the first pedestal of the cold plate and the first power semiconductor.

In some aspects, the techniques described herein relate to a power semiconductor package, wherein the second frame includes a sloped surface configured to receive the thermal interface material.

In some aspects, the techniques described herein relate to a power semiconductor package, wherein a surface of the second frame configured to contact the first power semiconductor includes one or more of a protrusion or a recess.

In some aspects, the techniques described herein relate to a power semiconductor package, wherein the thermal interface material includes one or more of a dispensed gel, a pad, or a thermal material.

In some aspects, the techniques described herein relate to a power semiconductor package, wherein the second frame includes a rib that connects a first portion of the second frame to a second portion of the second frame.

In some aspects, the techniques described herein relate to a power semiconductor package, wherein the second frame is configured to receive a second power semiconductor, wherein the rib is between the first power semiconductor and the second power semiconductor.

In some aspects, the techniques described herein relate to a power semiconductor package, wherein the second frame includes a sloped surface configured to receive the thermal interface material, wherein a surface of the second frame configured to contact the first power semiconductor includes one or more of a protrusion or a recess, and wherein the second frame includes a rib that connects a first portion of the second frame to a second portion of the second frame.

In some aspects, the techniques described herein relate to a power semiconductor package, wherein the first frame extends from the first pedestal to cover at least a portion of the floor of the cold plate.

In some aspects, the techniques described herein relate to a power semiconductor package, wherein the cold plate further includes a second pedestal extending from the floor, wherein the second pedestal is configured to support a second power semiconductor.

In some aspects, the techniques described herein relate to a power semiconductor package, wherein the spacer is configured to cover the first pedestal and the second pedestal.

In some aspects, the techniques described herein relate to an inverter including a power semiconductor package.

In some aspects, the techniques described herein relate to a vehicle including a inverter.

In some aspects, the techniques described herein relate to a spacer including: a first frame configured to receive at least a portion of a first pedestal of a cold plate; and a second frame configured to receive a thermal interface material, wherein the thermal interface material is configured to transfer heat from a first power semiconductor to the first pedestal of the cold plate; wherein the spacer is configured to control a thickness of the thermal interface material between the first pedestal of the cold plate and the first power semiconductor.

In some aspects, the techniques described herein relate to a spacer, wherein the second frame includes a sloped surface.

In some aspects, the techniques described herein relate to a spacer, wherein the second frame includes one or more of a protrusion or a recess.

In some aspects, the techniques described herein relate to a spacer, wherein the second frame includes a rib that connects a first portion of the second frame to a second portion of the second frame.

In some aspects, the techniques described herein relate to a spacer, wherein the second frame is configured to receive the first power semiconductor and a second power semiconductor.

In some aspects, the techniques described herein relate to a system including: an inverter configured to convert DC power from a battery to AC power to drive a motor, wherein the inverter includes: a power semiconductor package including: a first power semiconductor; a cold plate including a floor and a first pedestal extending from the floor, wherein the first pedestal is configured to support the first power semiconductor; a thermal interface material configured to transfer heat from the first power semiconductor to the first pedestal of the cold plate; and a spacer including: a first frame configured to receive at least a portion of the first pedestal, and a second frame configured to receive the thermal interface material; wherein the spacer is configured to control a thickness of the thermal interface material between the first pedestal of the cold plate and the first power semiconductor.

In some aspects, the techniques described herein relate to a system, wherein: the second frame includes a sloped surface configured to receive the thermal interface material, a surface of the second frame configured to contact the first power semiconductor includes one or more of a protrusion or a recess, and the second frame includes a rib that connects a first portion of the second frame to a second portion of the second frame.

In some aspects, the techniques described herein relate to a system, further including: the battery configured to supply the DC power to the inverter; and the motor configured to receive the AC power from the inverter to drive the motor.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
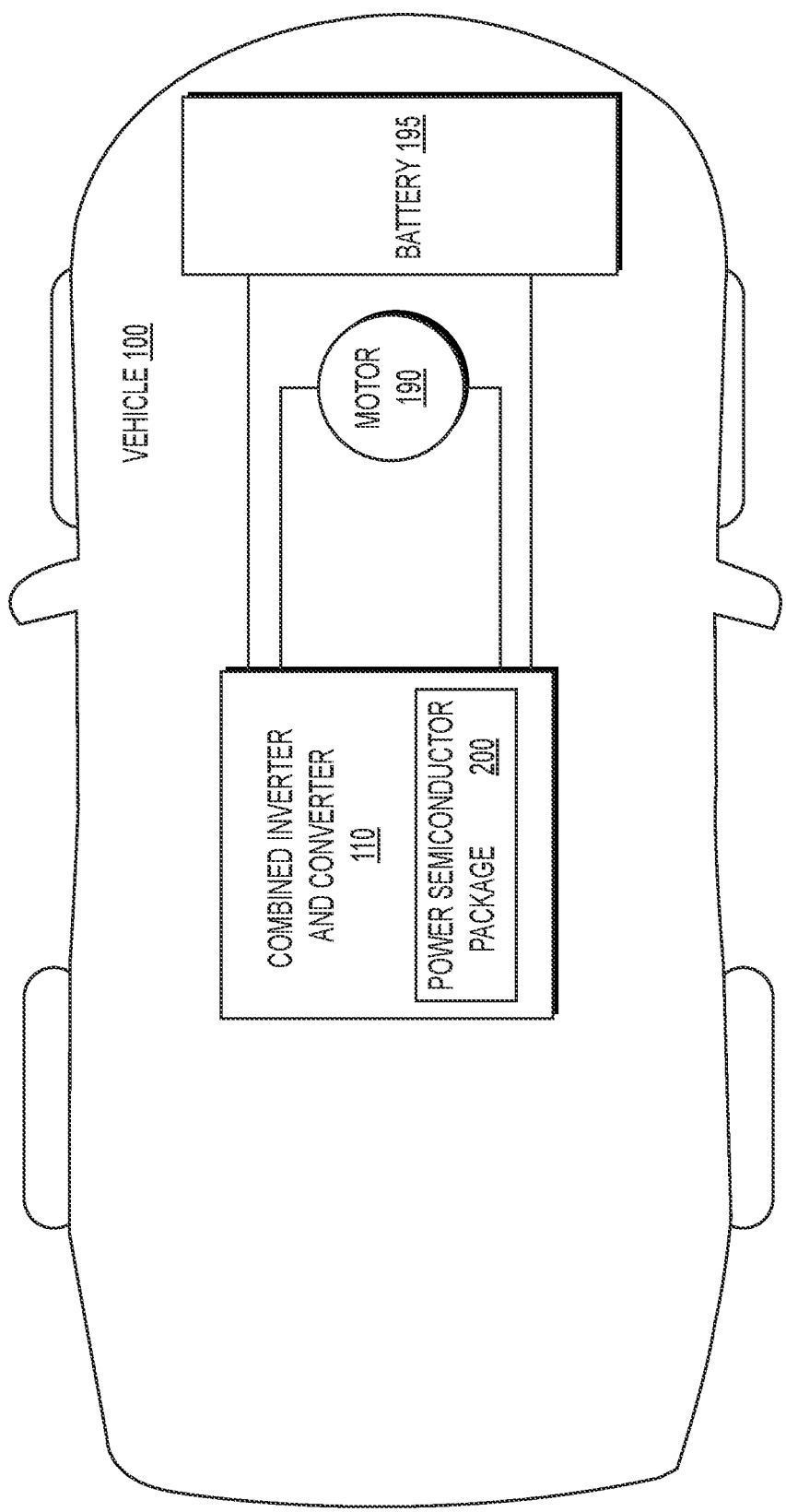
FIG. 1 depicts an exemplary system infrastructure for a vehicle including a combined inverter and converter including a power semiconductor package, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to a thermal interface spacer, and, more particularly, to systems and methods for a top side cooled power semiconductor thermal interface spacer.

Some power semiconductor packages may include leads or may be configured to be surface mounted. Leaded packages may provide lower electrical parameters, such as inductance, and may be installed with more complex mechanical clamping. Surface mount packages may provide better thermal performance due to direct mounting to a cold plate or alternative heat sink. Some top side cooled power semiconductor packages may combine the advantages of both leaded and surface mount packages into a single package with features that facilitate manufacturing efficiencies, lower electrical parameters, simpler mechanical clamping, and direct cooling capabilities.

However, a potential mechanical problem with top side cooled power semiconductor packages may be maintaining a lower thermal resistance between the cold plate and device (e.g., the semiconductors). A thermal interface material ("TIM") may be used as a thin isolation barrier between the cold plate and semiconductors. A potential electrical problem with top side cooled power semiconductor packages may be maintaining electrical isolation between a live high voltage part, such as a tab, of the power semiconductor, and the cold plate. Decreasing the gap between the cold plate and power semiconductor package may lead to creepage and clearance problems, which may lead to electrical isolation failure.

One or more embodiments may provide a thermal interface spacer that creates a uniform controlled gap between a power semiconductor and a cold plate for top side cooled packages. One or more embodiments may provide a spacer to allow TIM to be placed in the uniform controlled gap between the power semiconductor and cold plate. One or more embodiments may provide a spacer for a controlled gap and TIM that may create a controlled thermal resistance between the power semiconductor and the cold plate. One or more embodiments may provide a spacer that reduces creepage and clearance issues between high voltage parts of the semiconductors and the cold plate. One or more embodiments may provide a uniform TIM that may aid in thermal conduction (e.g., heat transfer) between the semiconductors and cold plate.

As will be described in greater detail below, the spacer may include one or more of a sidewall, a sloped inner wall, or a castle wall. The sloped inner wall may create an overlap between the TIM and the spacer to prevent the TIM from being cut or creating an air gap. The castle wall may allow excess TIM to exit the spacer when the power semiconductor is installed on the spacer. The sidewall of the spacer may lock the spacer in place for alignment of the cold plate and TIM. The sidewall of the spacer may provide adequate creepage distance from the power semiconductor to the cold plate.

One or more embodiments may provide a spacer that may address a high potential test of a dielectric strength in an over-voltage situation within an inverter system. One or more embodiments may provide a spacer that creates temperature balancing and/or uniformity between semiconductors that dissipate similar power due to uniformity of the TIM bond line.

FIG. 1 depicts an exemplary system infrastructure for a vehicle including a combined inverter and converter including a power semiconductor package, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may include a power semiconductor package 200. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
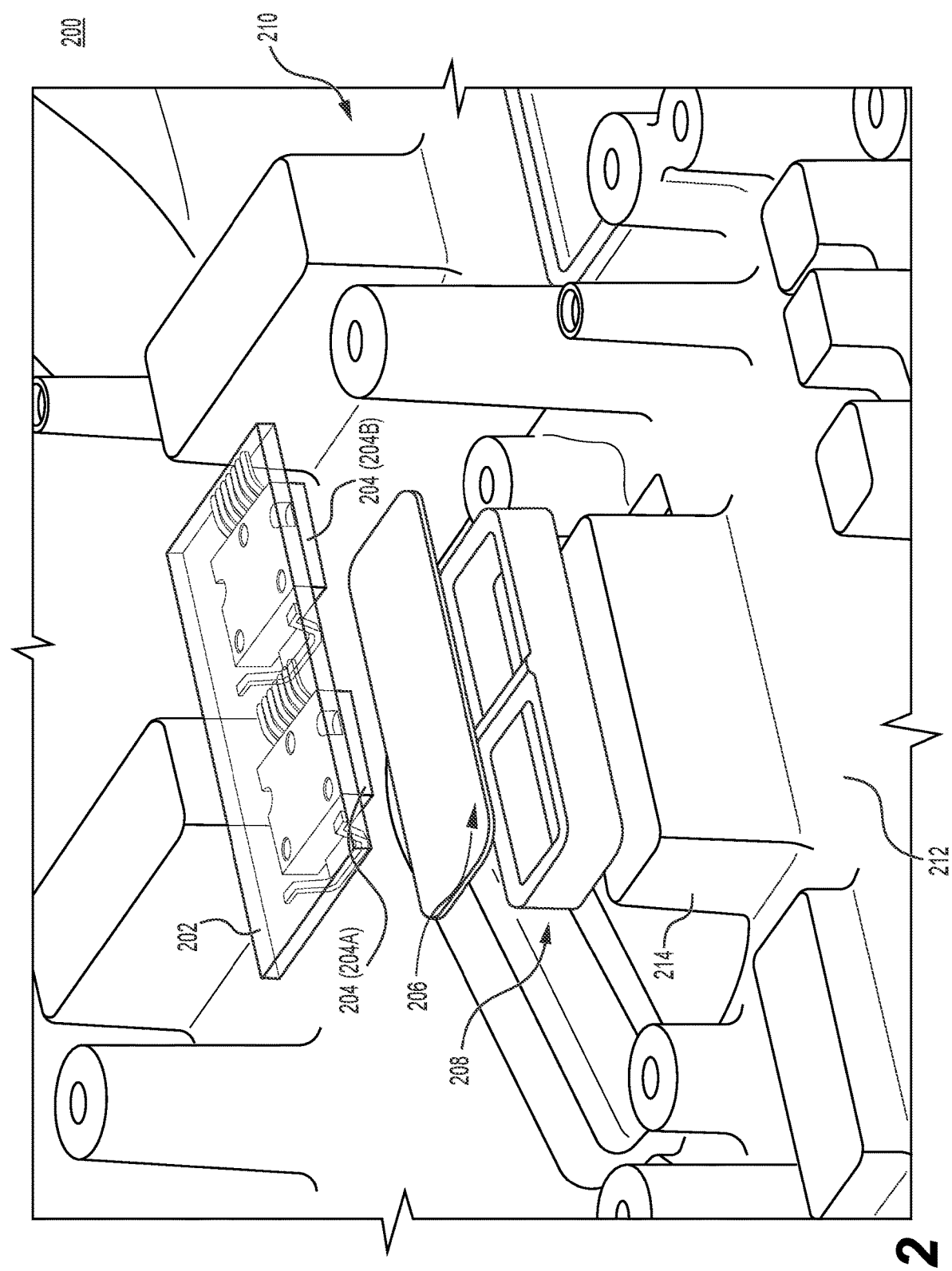
FIG. 2 depicts an exemplary power semiconductor package including a thermal interface spacer, according to one or more embodiments.

FIG. 2 depicts an exemplary power semiconductor package 200 including a thermal interface spacer 208, according to one or more embodiments. The power semiconductor package 200 may include a printed circuit board ("PCB") 202, power semiconductor 204 (which may be one or more power semiconductors, such as first power semiconductor 204A and second power semiconductor 204B, for example), TIM 206, spacer 208, and cold plate 210. The cold plate 210 may include a pedestal 214 that extends from a floor 212 of the cold plate 210. The spacer 208 may provide a controlled gap for TIM 206 to provide a controlled thermal resistance between the power semiconductor 204 and the pedestal 214. Spacer 208 may reduce potential creepage and clearance issues between power semiconductor 204 and cold plate 210.

Figure 3:
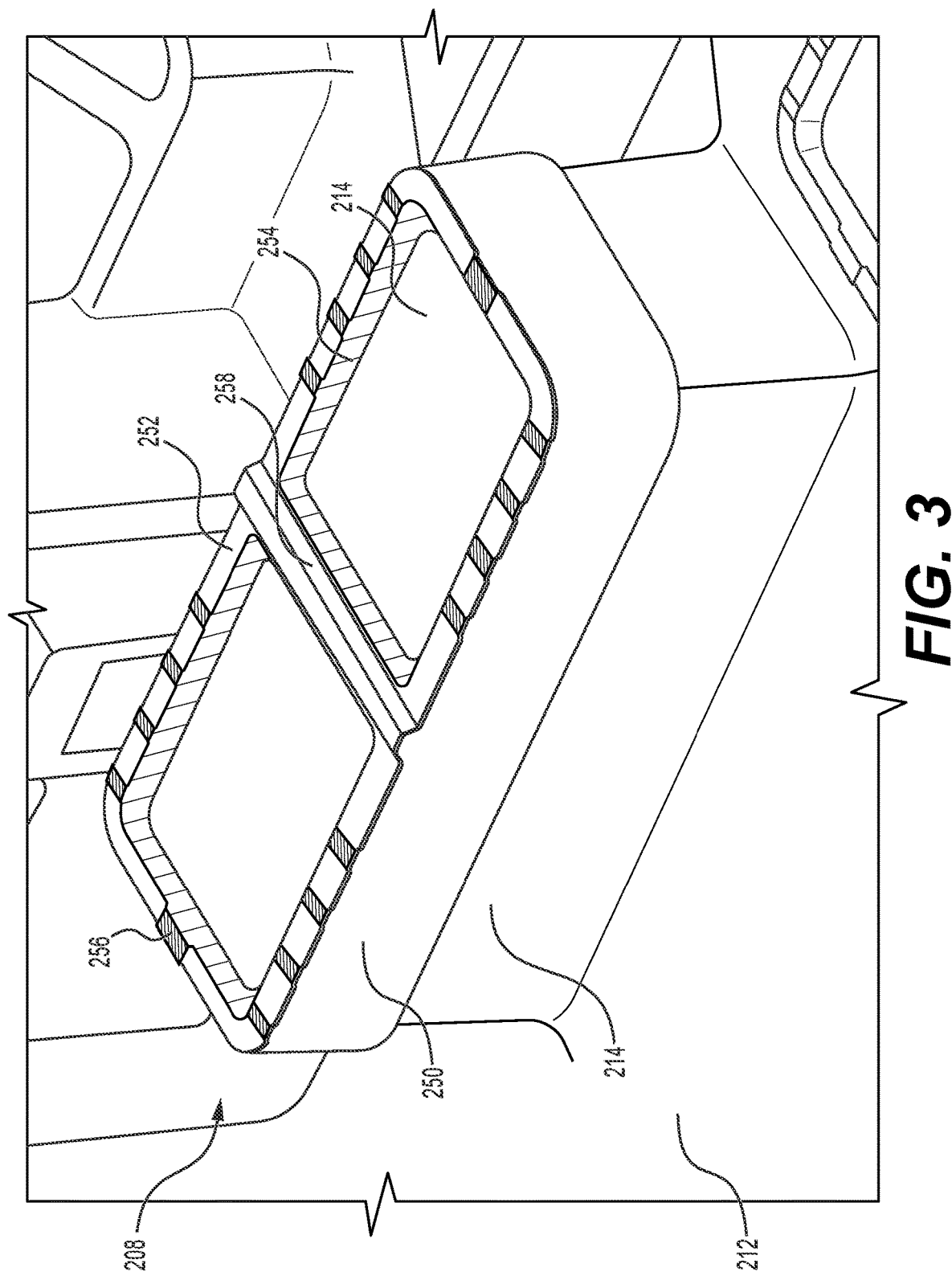
FIG. 3 depicts an exemplary thermal interface spacer including a support rib and mounted on one pedestal, according to one or more embodiments.

Pedestal 214 may have a generally rectangular cross section with rounded corners. Spacer 208 may be supported by and surround a portion of the pedestal 214. The spacer 208 may include a first frame (first frame 250 as shown in FIG. 3) including a first opening configured to receive the portion of the pedestal 214. An outer surface of the portion of the pedestal 214 may contact an inner surface of the spacer 208. The spacer 208 may have a generally rectangular cross section shape with rounded corners that corresponds to the cross section shape of the pedestal 214.

The spacer 208 may have a second frame (second frame 252 as shown in FIG. 3) including a second opening configured to receive TIM 206. The spacer 208 may be configured to provide a uniform thickness of the TIM 206 between pedestal 214 of the cold plate 210 and a first power semiconductor 204A. The TIM 206 may include epoxy, silicon, or other elastomer products, for example. The TIM 206 may be provided as a dielectric pad, heat spreader, thermal compound, thermal gel (e.g., dispensable gel), thermal tape, phase change material, gap pad, thermal grease, or alternative thermal material, for example. TIM 206 may be located between the pedestal 214 and the power semiconductor 204. TIM 206 may be configured to control a thermal resistance between the power semiconductor 204 and the pedestal 214.

The power semiconductor 204 may contact the TIM 206 on a first side. The power semiconductor 204 may connect to PCB 202 on a second side, opposite to the first side. The power semiconductor 204 may be one or more switches or rectifiers of the inverter 110.

FIG. 3 depicts an exemplary thermal interface spacer including a support rib and mounted on one pedestal, according to one or more embodiments. In FIG. 3, spacer 208 is mounted on, or connected to, pedestal 214. The spacer 208 may include a first frame 250 configured to receive at least a portion of pedestal 214, and a second frame 252 configured to receive the TIM 206 (see FIG. 2). The second frame 252 may be provided on a portion of the first frame 250 opposite to a portion of the first frame 250 nearest to the floor 212 of the cold plate 210. The first frame 250 may include four sidewalls, where two opposing sidewalls may have longer lengths than the neighboring two sidewalls to form the spacer 208 generally in the shape of a rectangle. The corners of the spacer 208 (e.g., where the sidewalls connect) may be rounded.

Figure 6:
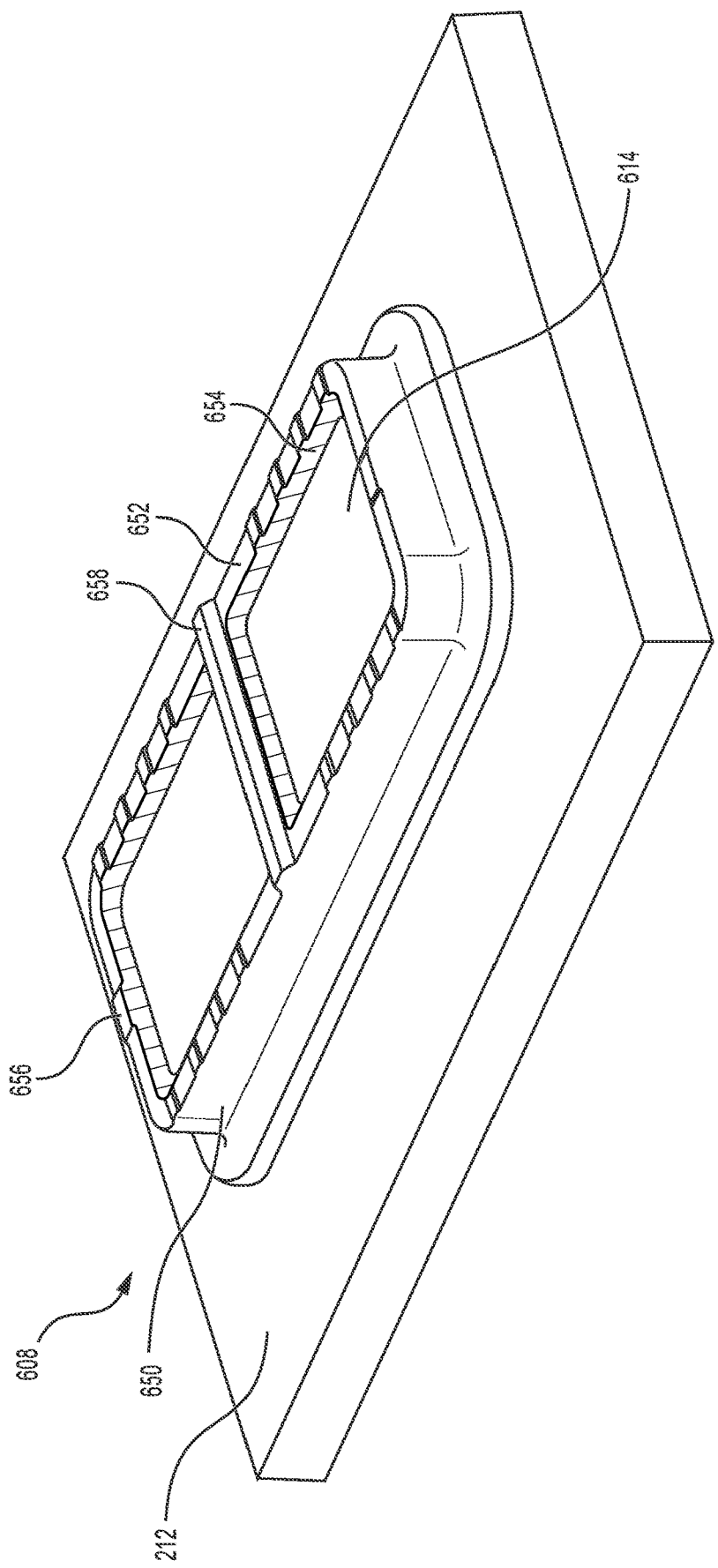
FIG. 6 depicts an exemplary thermal interface spacer with an extended frame, according to one or more embodiments.

The first frame 250 may extend from a surface of the pedestal 214 furthest from the floor 212 on the sides of the outer walls of the pedestal 214 towards the floor 212. The first frame 250 may encircle and/or wrap around a portion of the outer walls of the pedestal 214. As depicted in FIG. 6, the first frame 250 may cover an entirety of the outer walls of the pedestal 214 and extend from the outer walls to cover at least a portion of the floor 212 surrounding the pedestal 214.

The second frame 252 may include a rib 258 that connects a first portion of the second frame 252 to a second portion of the second frame 252. For example, the first portion of the second frame 252 and second portion of the second frame 252 that are connected by a rib 258 may be located at a midpoint of opposing sidewalls of the second frame 252. The rib 258 may provide structural support for the spacer 208. For example, when TIM 206 is installed in spacer 208, rib 258 may prevent the opposing sidewalls of the second frame 252 from spreading apart due to a pressing force from TIM 206.

The second frame 252 may have the same cross section shape as the cross section shape of the first frame 250. The second frame 252 may include a sloped surface 254 configured to receive the TIM 206. The sloped surface 254 may be sloped toward an interior of spacer 208. The sloped surface 254 may be located in an inner portion of the second frame 252. The sloped surface 254 may provide an inner perimeter of second frame 202 that increases in a direction away from a surface of pedestal 214, such that an inner perimeter of sloped surface 254 at a surface of pedestal 214 is smaller than an inner perimeter of sloped surface 254 at a position away from the surface of pedestal 214. The sloped surface 254 may extend along each wall of the second frame 252 and connect at each corner of the second frame 252. The sloped surface 254 may form two rectangle portions, separated by rib 258, along second frame 252. The sloped surface 254 may create an overlap between the TIM 206 and spacer 208 to prevent the TIM 206 from being cut and/or to prevent an air gap from forming between the TIM 206 and pedestal 214.

The second frame 252 may include castle wall 256 along the surface of second frame 252 configured to face away from pedestal 208. The castle wall 256 may include one or more surface features, such as one or more of a protrusion, an irregularity, a bump, or a recess, for example. One or more of a size, a shape, a spacing, or a quantity of the surface features of castle wall 256 may be based on a viscosity of the TIM 206. For example, castle wall 256 may include fewer surface features with a TIM 206 with a higher viscosity, and may include more surface features with a TIM 206 with a lower viscosity. For example, castle wall 256 may include only one protrusion on each wall of second frame 252. As depicted in FIG. 3, castle wall 256 may include eighteen protrusions on second frame 252.

Figure 4:
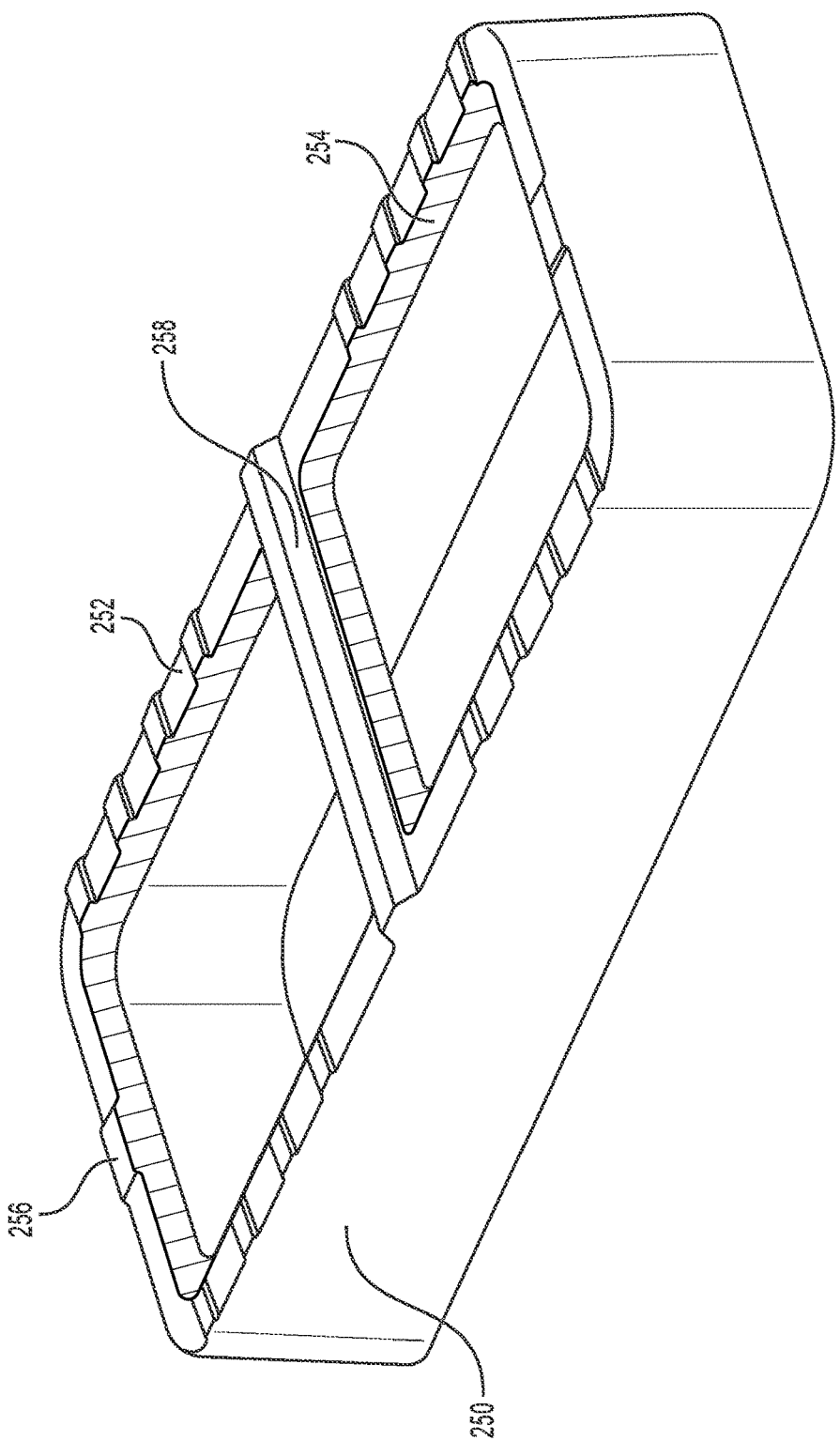
FIG. 4 depicts an exemplary thermal interface spacer including a support rib, according to one or more embodiments.

FIG. 4 depicts an exemplary thermal interface spacer including a support rib, according to one or more embodiments. The sloped surface 254 may have a slope ranging from approximately 20 degrees to approximately 70 degrees. The sloped surface 254 may have a slope that reduces air gaps between the TIM 206 and pedestal 214, without significantly changing an overall thermal resistance of the TIM 206. For example, the sloped surface 254 may be sloped by 45 degrees relative to a surface of pedestal 214 contacting sloped surface 254.

Figure 5:
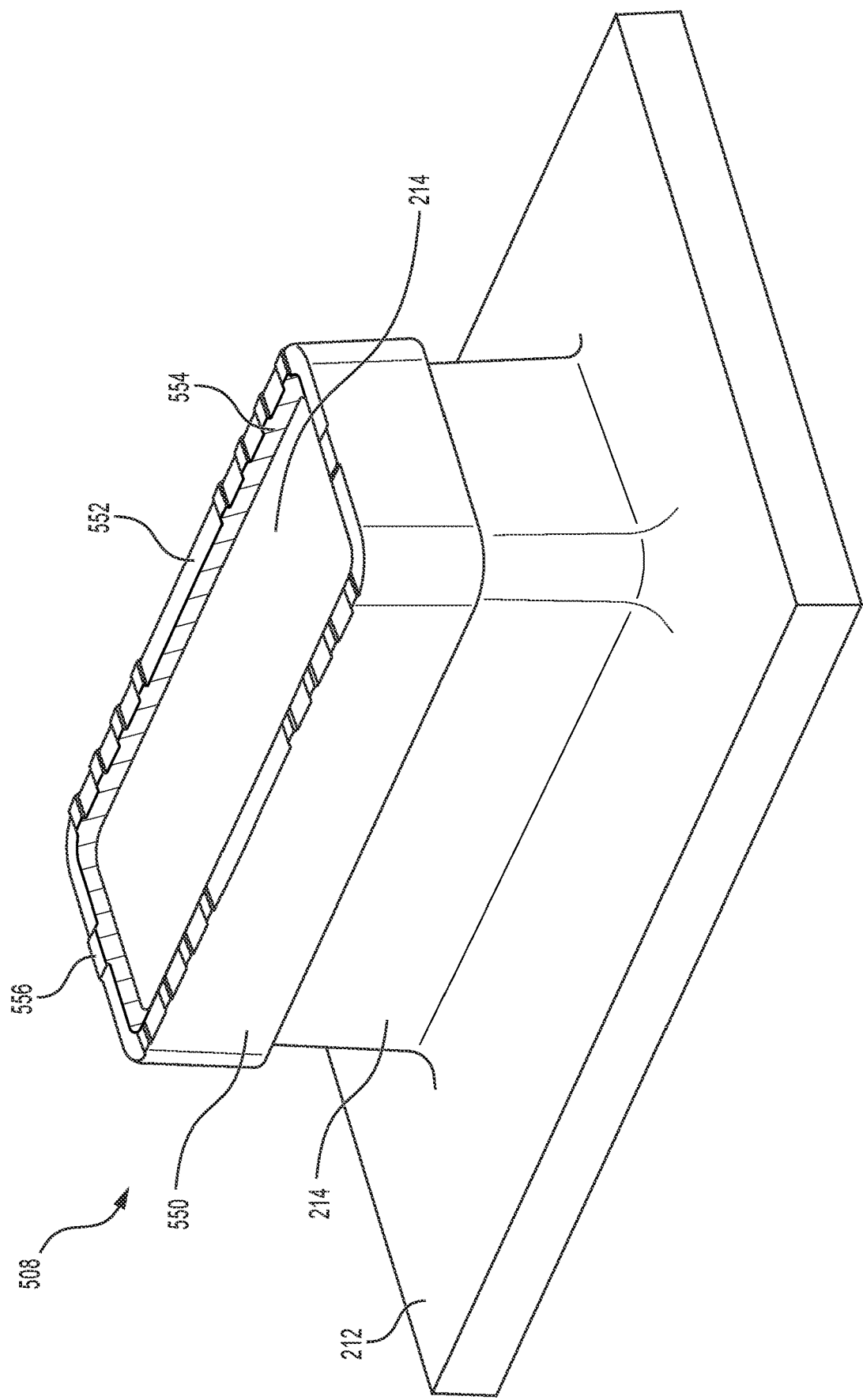
FIG. 5 depicts an exemplary thermal interface spacer, according to one or more embodiments.

FIG. 5 depicts an exemplary thermal interface spacer, according to one or more embodiments. In FIG. 5, spacer 508 is mounted on, or connected to, pedestal 214. The spacer 508 may include a first frame 550 configured to receive at least a portion of pedestal 214 and a second frame 552 configured to receive the TIM 206. The second frame 552 may be provided on a portion of the first frame 550 opposite to a portion of the first frame 250 facing the floor 212 of the cold plate 210. The second frame 552 may include a sloped surface 554. The second frame 552 may include a castle wall 556 along the surface of second frame 552 configured to face away from pedestal 208. The elements described above in FIG. 5 may be similar to corresponding elements described in FIG. 3 in structure and function.

As shown in FIG. 5, the spacer 508 may not include a rib (e.g. rib 258 shown in FIG. 3). As shown in FIG. 5, second frame 552 may include a continuous sloped surface 554. Although not shown, the spacer 508 may include a first portion (e.g., a section covering a pedestal 214) with no rib and a second portion (e.g., a section covering a second pedestal) that includes a rib (e.g. rib 258) connecting two sidewalls.

FIG. 6 depicts an exemplary thermal interface spacer with an extended frame, according to one or more embodiments. In FIG. 6, spacer 608 is mounted on, or connected to, pedestal 214. The spacer 608 may include a first frame 650 configured to receive at least a portion of pedestal 614, and a second frame 652 configured to receive the TIM 206. As shown in FIG. 6, first frame 650 may extend from the second frame 652 to cover at least a portion of floor 212 of the cold plate 210. The second frame 652 may include a sloped surface 654. The second frame 652 may include a castle wall 656 along the surface of second frame 552 configured to face away from pedestal 208. The second frame 652 may include a rib 658 that connects a first portion of the second frame 652 to a second portion of the second frame 652. The elements described above in FIG. 6 may be similar to corresponding elements described in FIG. 3 in structure and function.

Spacer 608 may cover all sidewalls of the pedestal 614. The first frame 650 may extend from the second frame 652 to the floor 212 of cold plate 210. The first frame 650 may extend to the floor 212 of cold plate 210 and extend along the floor 212 of the cold plate 210. The extension of the first frame 650 may provide additional creepage distance from the power semiconductor 204 as measured along a surface of spacer 608. The extension of first frame 650 may extend along the floor 212 of the cold plate 210 to maintain a threshold creepage distance as measured along a surface of spacer 608 from power semiconductor 204 to floor 212 of the cold plate 210. If the design of pedestal 214 is changed so that a distance between the semiconductor 204 and the floor 212 is decreased, then a distance that the first frame 650 extends along the floor 212 of the cold plate 210 may be increased to maintain the threshold creepage distance along the surface of spacer 608.

Figure 7:
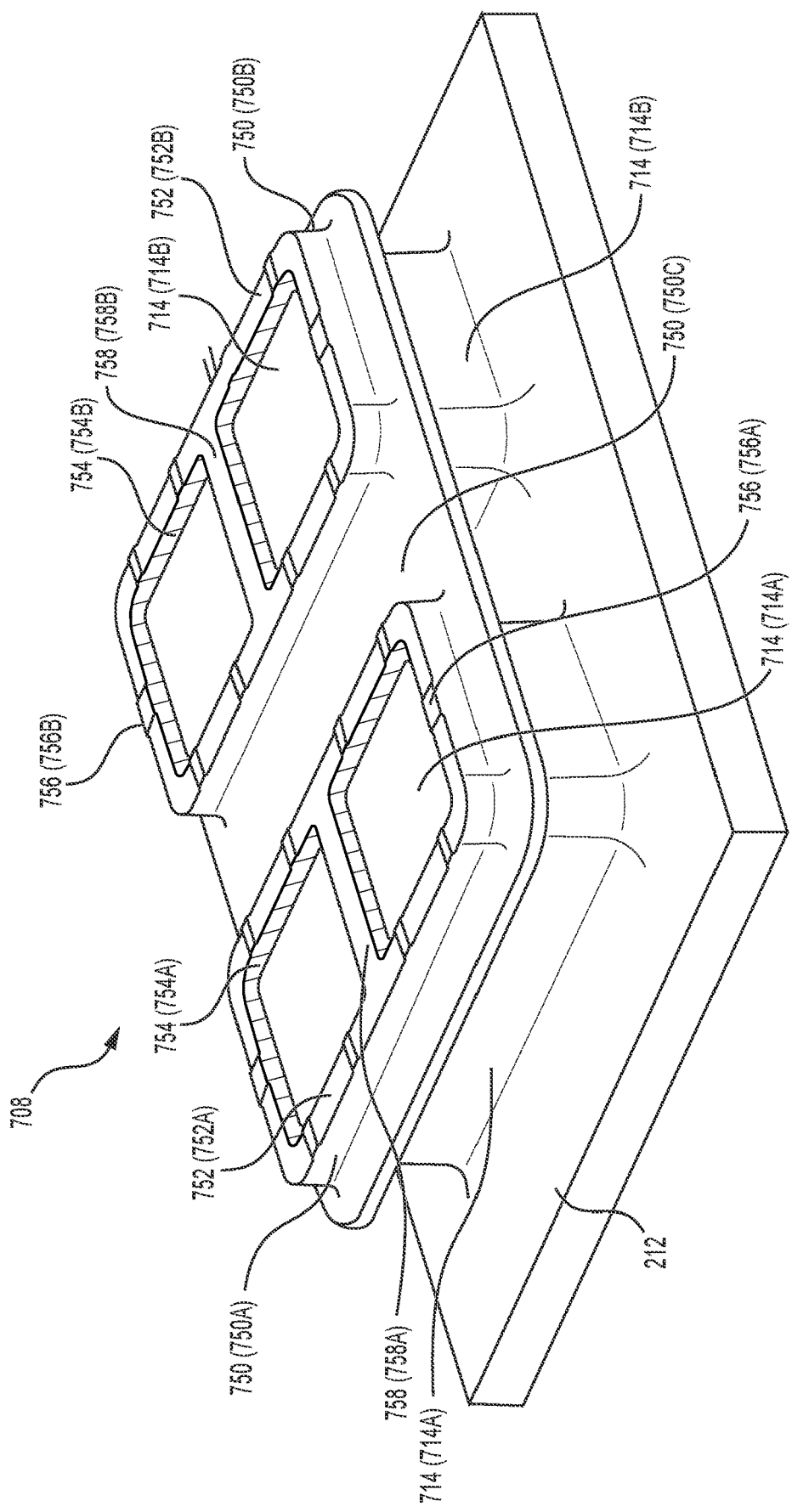
FIG. 7 depicts an exemplary thermal interface spacer mounted on two pedestals, according to one or more embodiments.

FIG. 7 depicts an exemplary thermal interface spacer mounted on two pedestals, according to one or more embodiments. In FIG. 7, spacer 708 is mounted on, or connected to, pedestal 714 extending from floor 212 of the cold plate 210. Pedestal 714 may include first pedestal 714A and second pedestal 714B. Spacer 708 may include one or more of a first frame 750, a second frame 752, a sloped surface 754, a castle wall 756, or a rib 758.

First frame 750 may include a first frame first portion 750A configured to receive at least a portion of the first pedestal 714A, a first frame second portion 750B configured to receive at least a portion of the second pedestal 714B, and a first frame connecting portion 750C configured to connect first frame first portion 750A and first frame second portion 750B. Second frame 752 may include a second frame first portion 752A configured to receive a first portion of the TIM 206, and second frame second portion 752B configured to receive a second portion of the TIM 206.

The second frame 752 may include sloped surface 754, castle wall 756, and rib 758. Sloped surface 754 may include first sloped surface 754A and second sloped surface 754B. Castle wall 756 may include first castle wall 756A and second castle wall 756B. Rib 758 may include first rib 758A and second rib 758B. The second frame first portion 752A may include first sloped surface 754A, first castle wall 756A, and first rib 758A. The second frame second portion 752B may include second sloped surface 754B, second castle wall 756B, and second rib 758B. The elements described above in FIG. 7 may be similar to corresponding elements described in FIG. 3 in structure and function.

One or more embodiments may provide a thermal interface spacer that creates a uniform controlled gap between a power semiconductor and a cold plate for top side cooled packages. One or more embodiments may provide a spacer to allow TIM to be placed in the uniform controlled gap between the power semiconductor and cold plate. One or more embodiments may provide a spacer for a controlled gap and TIM that may create a controlled thermal resistance between the power semiconductor and the cold plate. One or more embodiments may provide a spacer that reduces creepage and clearance issues between high voltage parts of the semiconductors and the cold plate. One or more embodiments may provide a uniform TIM that may aid in thermal conduction (e.g., heat transfer) between the semiconductors and cold plate.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A power semiconductor package comprising:
   a first power semiconductor;
   a cold plate including a floor and a first pedestal extending from the floor, wherein the first pedestal is configured to support the first power semiconductor;
   a thermal interface material configured to transfer heat from the first power semiconductor to the first pedestal of the cold plate; and
   a spacer including:
   a first frame configured to receive at least a portion of the first pedestal, and a second frame configured to receive the thermal interface material;
wherein the spacer is configured to provide a uniform thickness of the thermal interface material between the first pedestal of the cold plate and the first power semiconductor.

2. The power semiconductor package of claim 1, wherein the second frame includes a sloped surface configured to receive the thermal interface material.

3. The power semiconductor package of claim 1, wherein a surface of the second frame configured to contact the first power semiconductor includes one or more of a protrusion or a recess.

4. The power semiconductor package of claim 1, wherein the thermal interface material includes one or more of a dispensed gel, a pad, or a thermal material.

5. The power semiconductor package of claim 1, wherein the second frame includes a rib that connects a first portion of the second frame to a second portion of the second frame.

6. The power semiconductor package of claim 5, wherein the second frame is configured to receive a second power semiconductor, wherein the rib is between the first power semiconductor and the second power semiconductor.

7. The power semiconductor package of claim 1, wherein the second frame includes a sloped surface configured to receive the thermal interface material, wherein a surface of the second frame configured to contact the first power semiconductor includes one or more of a protrusion or a recess, and wherein the second frame includes a rib that connects a first portion of the second frame to a second portion of the second frame.

8. The power semiconductor package of claim 1, wherein the first frame extends from the first pedestal to cover at least a portion of the floor of the cold plate.

9. The power semiconductor package of claim 1, wherein the cold plate further includes a second pedestal extending from the floor, wherein the second pedestal is configured to support a second power semiconductor.

10. The power semiconductor package of claim 9, wherein the spacer is configured to cover the first pedestal and the second pedestal.

11. An inverter comprising the power semiconductor package of claim 1.

12. A vehicle comprising the inverter of claim 11.

13. A spacer including:
a first frame configured to receive at least a portion of a first pedestal of a cold plate; and
a second frame configured to receive a thermal interface material, wherein the thermal interface material is configured to transfer heat from a first power semiconductor to the first pedestal of the cold plate;
wherein the spacer is configured to control a thickness of the thermal interface material between the first pedestal of the cold plate and the first power semiconductor.

14. The spacer of claim 13, wherein the second frame includes a sloped surface.

15. The spacer of claim 13, wherein the second frame includes one or more of a protrusion or a recess.

16. The spacer of claim 13, wherein the second frame includes a rib that connects a first portion of the second frame to a second portion of the second frame.

17. The spacer of claim 16, wherein the second frame is configured to receive the first power semiconductor and a second power semiconductor.

18. A system comprising:
an inverter configured to convert DC power from a battery to AC power to drive a motor, wherein the inverter includes:
a power semiconductor package including:
a first power semiconductor;
a cold plate including a floor and a first pedestal extending from the floor, wherein the first pedestal is configured to support the first power semiconductor;
a thermal interface material configured to transfer heat from the first power semiconductor to the first pedestal of the cold plate; and
a spacer including:
a first frame configured to receive at least a portion of the first pedestal, and
a second frame configured to receive the thermal interface material;
wherein the spacer is configured to control a thickness of the thermal interface material between the first pedestal of the cold plate and the first power semiconductor.

19. The system of claim 18, wherein:
the second frame includes a sloped surface configured to receive the thermal interface material,
a surface of the second frame configured to contact the first power semiconductor includes one or more of a protrusion or a recess, and
the second frame includes a rib that connects a first portion of the second frame to a second portion of the second frame.

20. The system of claim 18, further comprising:
the battery configured to supply the DC power to the inverter; and
the motor configured to receive the AC power from the inverter to drive the motor.

* * * * *